(12) United States Patent
Sabut et al.

(10) Patent No.: US 8,872,594 B2
(45) Date of Patent: Oct. 28, 2014

(54) COMPARATOR-LESS PULSE-WIDTH MODULATION

(75) Inventors: Marc Sabut, Eybens (FR); Severin Trochut, Gilly sur Isere (FR); Christophe Curis, Grenoble (FR)

(73) Assignees: STMicroelectronics SA, Montrouge (FR); STMicoelectronics (Grenoble 2) SAS, Grenoble (FR)

( * ) Notice: Subject to any disclaimer, the term of this patent is extended or adjusted under 35 U.S.C. 154(b) by 97 days.

(21) Appl. No.: 13/537,938

(22) Filed: Jun. 29, 2012

(65) Prior Publication Data

US 2013/0002366 A1    Jan. 3, 2013

(30) Foreign Application Priority Data

Jun. 30, 2011    (FR) ...................................... 11 55872

(51) Int. Cl.
*H03K 7/08* (2006.01)
*H02M 3/156* (2006.01)

(52) U.S. Cl.
CPC *H03K 7/08* (2013.01); *H02M 3/156* (2013.01)
USPC ......................................... 332/110; 332/109

(58) Field of Classification Search
CPC ...................................................... H03K 7/08
USPC ............ 332/109, 110; 323/282, 288; 375/238
See application file for complete search history.

(56) References Cited

U.S. PATENT DOCUMENTS

| 3,136,961 | A | 6/1964 | Schraivogel |
| 3,286,200 | A | 11/1966 | Foulger |
| 5,583,422 | A | 12/1996 | Schirmer et al. |
| 2007/0262801 | A1* | 11/2007 | Renaud et al. ................ 327/172 |
| 2009/0262556 | A1 | 10/2009 | Tomiyoshi et al. |
| 2010/0289466 | A1 | 11/2010 | Telefus |
| 2010/0315838 | A1 | 12/2010 | Mao et al. |

OTHER PUBLICATIONS

Chang et al., "On Randomized Harmonic Spectrum Control for a Flyback Switch-Mode Rectifier," International Conference on Power Electronics and Drive Systems, IEEE, Piscataway, NJ, USA, Nov. 2-5, 2009, pp. 28-33.
French Search Report dated Jul. 2, 2012, for French Application No. 1155872, 7 pages.
Italian Search Report dated Dec. 5, 2011, for Italian Application No. MI20110546, 8 pages.

* cited by examiner

*Primary Examiner* — Ryan Johnson
(74) *Attorney, Agent, or Firm* — Seed IP Law Group PLLC

(57) ABSTRACT

A pulse width modulation device includes a switching transistor for defining modulation phases, a capacitor, and switches arranged to: a) in a first phase, charge the capacitor to a voltage corresponding to the on/off threshold of the switching transistor, and b) in a second phase, connect the capacitor between a terminal for applying a setpoint voltage and the gate of the switching transistor. A constant current source is connected to apply a current in the capacitor tending to bring the gate of the switching transistor toward the on/off threshold.

19 Claims, 3 Drawing Sheets

COMPARATOR-LESS PULSE-WIDTH MODULATION

BACKGROUND

1. Technical Field

The present disclosure relates to switching mode power supplies and in particular to pulse width modulation regulation devices (PWM) used in these power supplies.

2. Description of the Related Art

FIG. 1 schematically shows a conventional switching mode power supply. The regulated voltage Vout is taken from the terminals of a filtering capacitor Cf. This capacitor is connected in series with an inductor L between a reference potential, the ground Vground, and the output of a push-pull stage 10 formed by a pair of complementary MOS transistors, powered between the ground and a positive voltage Vbattery, for example a battery voltage.

A differential amplifier 12 supplies an error voltage Verror proportional to the difference between a reference voltage Vreference and the output voltage Vout. A comparator 14 receives the voltage Verror and a periodic sawtooth signal Vper produced by a ramp generator 16. The comparator 14 thus supplies a pulse width modulated signal whose duty factor is proportional to the error voltage Verror. This pulse width modulated signal is shaped by a circuit DRV driving the complementary pair 10.

FIG. 2 is a chronogram showing the generation of the pulse width modulated signal from the error signal Verror and the sawtooth signal Vper. The signal comprises Vper a periodic succession of rising ramps of same slope, starting from 0 and whose magnitude is constant and lower than Vbattery.

In FIG. 2, the voltage Verror is halfway up the ramps and defines a pulse width modulation signal having a duty factor of 0.5—the pulse width modulated signal is at 1 for the part of the ramps below Verror, and at 0 for the part of the ramps above Verror.

Details about making and operating systems of this type are described in [<<Fundamentals of Power Electronics>>, Robert W. Erikson, Dragan Maksimovic; Kluwer Academic Publishers; 3rd Revised edition (January 2001)].

In FIG. 2, when the error voltage Verror tends toward 0, i.e., when the output current of the switching mode power supply is low, the duty factor of the pulse width modulated signal also tends toward 0. Given the reaction time of the circuits, it is not possible to generate pulses having a quasi-zero width, hence it results that the duty factor becomes inaccurate. This inaccuracy is increased by the fact that the signal Verror, tending toward 0, disappears in the noise and its fluctuations become indistinguishable by the comparator 14. The result is fluctuations of the regulated voltage Vout when it tends toward its setpoint value, which may be unacceptable in some applications.

To avoid this drawback, it has been suggested to connect the low power supply terminal of the comparator to a negative power supply source with respect to the Vground, so that the comparator may take a low noise measurement of the voltage Verror when it tends toward 0. It therefore uses an additional power supply source.

It has also been suggested to set a reduced value of the duty factor, so that the pulse width always remains in a range where it may be determined with enough accuracy. It renders the system more complex due to the fact that this offset must be compensated when the output voltage is near the setpoint voltage. In addition, because the system is then always in a switching mode, especially when idle, the current consumption is increased.

BRIEF SUMMARY

There is therefore a need for a pulse width modulation device offering sufficient accuracy when the error voltage is near 0, while having a simple structure consuming little energy.

This need is tended to by providing a ramp signal defining the on and off phases of a switching transistor to perform a pulse width modulation, having at periodic intervals: an initial value at an on/off threshold voltage of the switching transistor; a step exceeding the initial value by an error voltage corresponding to a duty factor setpoint of the pulse width modulation; and a ramp, having a same slope for all the intervals, joining the step to the initial value, whereby the duration of the on phase of the switching transistor is proportional to the error voltage, with the same proportionality coefficient for all the intervals.

There is also provided a pulse width modulation device comprising a switching transistor having a gate, a source, and a drain for defining the modulation phases; a capacitor; switches arranged to: a) in a first phase, charge the capacitor to a voltage corresponding to the on/off threshold of the switching transistor, and b) in a second phase, connect the capacitor between a terminal for applying a setpoint voltage and the gate of the switching transistor; and a constant current source connected to apply a current in the capacitor tending to bring the gate of the switching transistor toward the on/off threshold.

According to an embodiment, the device comprises the switching transistor having its gate connected to a first terminal of the capacitor and its source connected to a reference potential line; a diode connected, in the first phase, between the first terminal of the capacitor and the reference potential line; and a transistor forming the constant current source, connecting the first terminal of the capacitor to the reference potential line.

According to an embodiment, the diode is formed by a transistor having the same characteristics as the switching transistor, the diode and the switching transistor being connected to have respective bias currents of same value.

According to an embodiment, the device comprises a circuit arranged to interrupt the current of the current source while the switching transistor is off.

According to an embodiment, the diode is part of a Wilson current mirror.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not intended to convey any information regarding the actual shape of the particular elements and have been selected for ease of recognition in the drawings. Embodiments discussed herein will be described in the following description, in relation with, but not limited to the appended figures wherein.

DETAILED DESCRIPTION

To avoid the drawbacks linked to the comparator in a pulse width modulator, a modulator without comparator is provided hereinafter.

Figure 3:
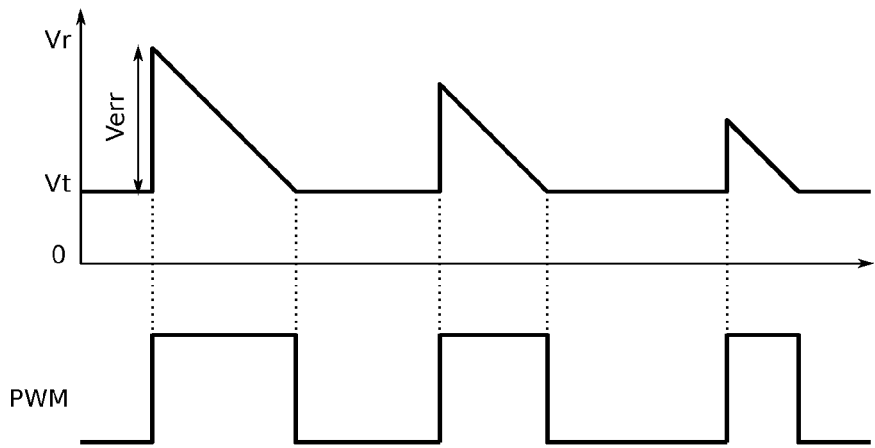
FIG. 3 is a chronogram showing the operating principle of a pulse width modulation device without comparator.

FIG. 3 is a chronogram showing the basic operation of such a modulator. A sawtooth voltage signal Vr is also used here, comprising ramps following one another at periodic intervals. They all have the same, decreasing slope. However, they have a variable magnitude, proportional to the instantaneous error voltage Verr, and they start from a quiescent value Vt different from zero. The value Vt corresponds to the on/off threshold of a switching transistor controlled by the signal Vr.

Each ramp starts, at a time determined by a periodic clock, by a step corresponding to the error voltage Verr, above the voltage Vt, and then decreases with a constant slope, the same for each successive ramp, until reaching again the quiescent value Vt. Thus, the duration of each ramp is proportional to the value of the initial step, equal to the error voltage Verr.

The quiescent value Vt corresponding to the turn-off limit of the switching transistor, this transistor is conductive only during the ramps, as shown by the evolution of the signal PWM.

Figure 4:
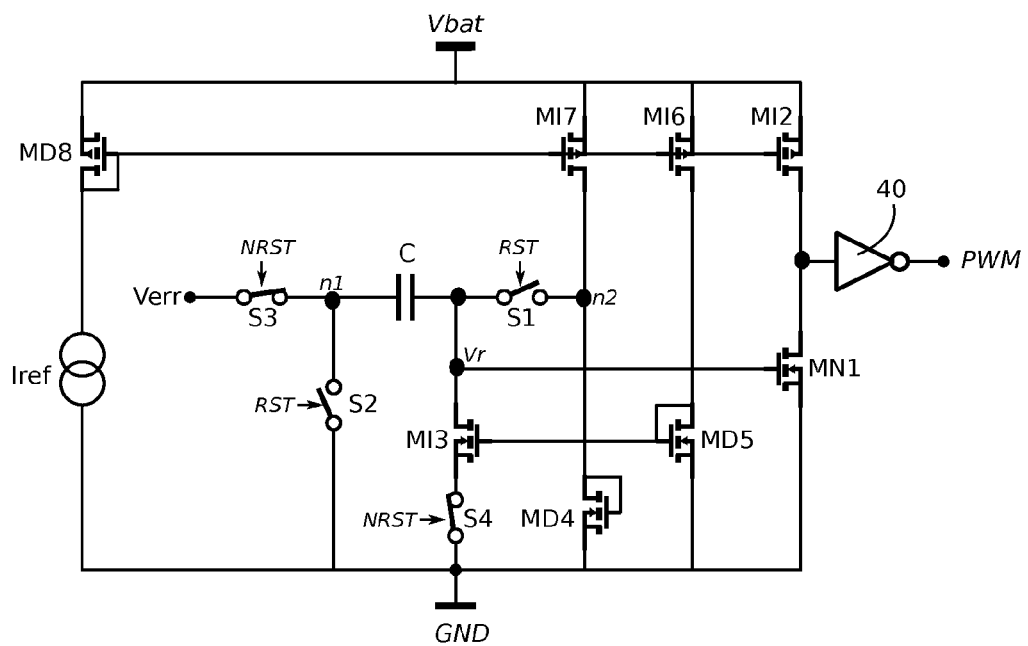
FIG. 4 schematically shows a first embodiment of a modulator operating according to the principle of FIG. 3.

FIG. 4 shows an embodiment of a modulator operating according to the principle of FIG. 3. It comprises a capacitor C associated to three switches S1, S2 and S3. A first terminal of the capacitor C, on which the sawtooth voltage Vr is produced, is connected to the gate of the above-mentioned switching transistor, an N-channel MOS transistor MN1 whose source is connected to the ground node GND. The transistor MN1 is biased from the positive power supply line Vbat by a current source MI2. The gate of the transistor MN1 is also connected to the ground GND node by a constant current source MI3. A switch S4 is arranged to interrupt the current of the source MI3.

Figure 1:
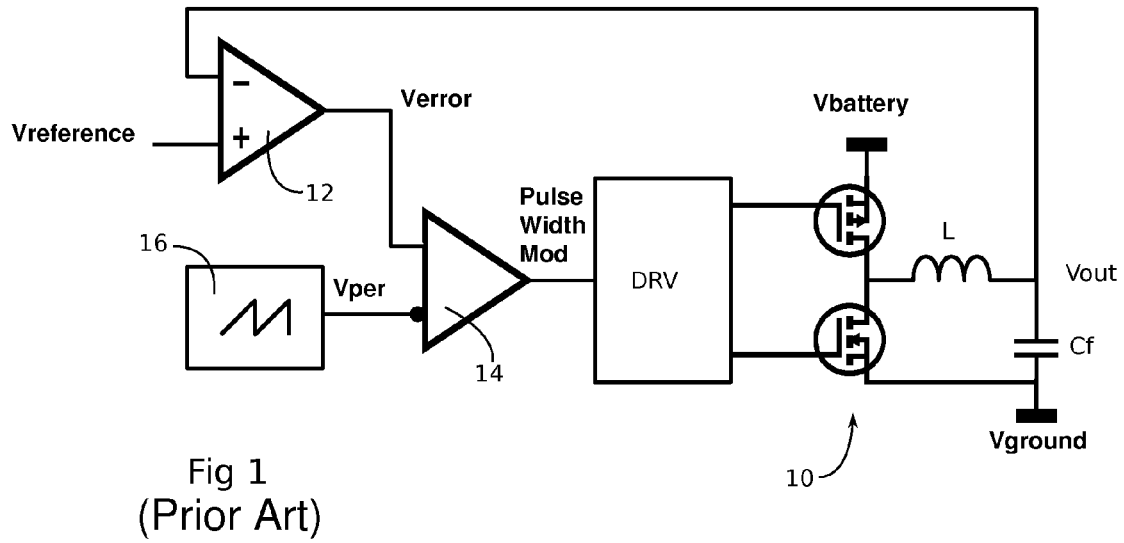
FIG. 1, previously described, schematically shows a conventional switching mode power supply.
Figure 2:
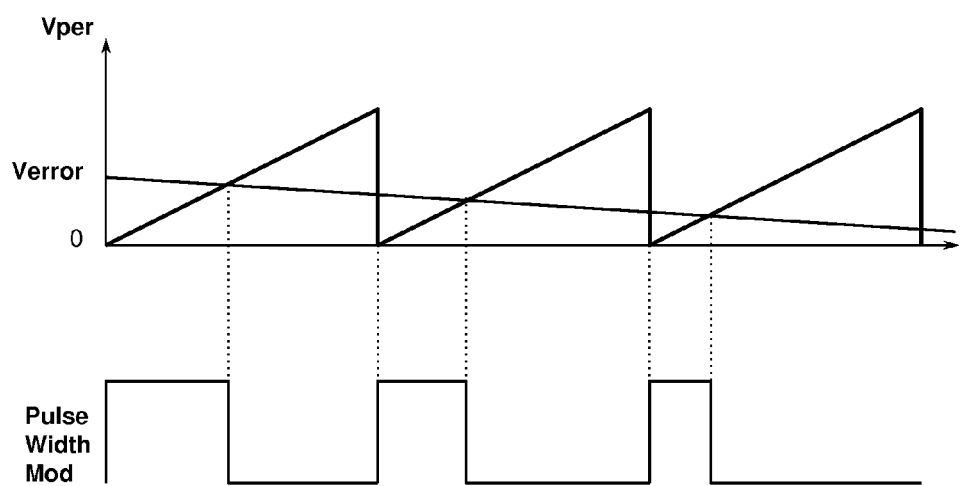
FIG. 2, previously described, is a chronogram showing the generation of a pulse width modulation signal in the power supply of FIG. 1.

The switch S1 connects the first terminal of the capacitor C to the ground GND node through a diode MD4. The second terminal of the capacitor C is connected to the ground by the switch S2 and connected by the switch S3 to a terminal receiving the error voltage Verr, supplied at low impedance by an amplifier, like in FIG. 1. The switches S1 and S2 are controlled in phase by a reset signal RST. The switches S3 and S4 are controlled by a signal NRST in phase opposition with the signal RST.

The current source MI3 is actually an N-channel MOS transistor connected as a current mirror to copy the current flowing through a diode MD5. The diode MD5 is connected to the ground and is biased from the line Vbat by a current source MI6. The diode MD4 is biased from the line Vbat by a current source MI7.

The current sources MI2, MI6 and MI7 are actually P-channel MOS transistors connected as current mirrors to copy the current flowing through a diode MD8, also connected to the line Vbat. The diode MD8 is biased from the ground by a reference current source Iref. This current source Iref thus sets, proportionally to the size ratios of the transistors involved, the values of all the other current sources.

The modulation control signal PWM is supplied by an inverter 40 whose input is connected to the drain of the switching transistor MN1.

Figure 5:
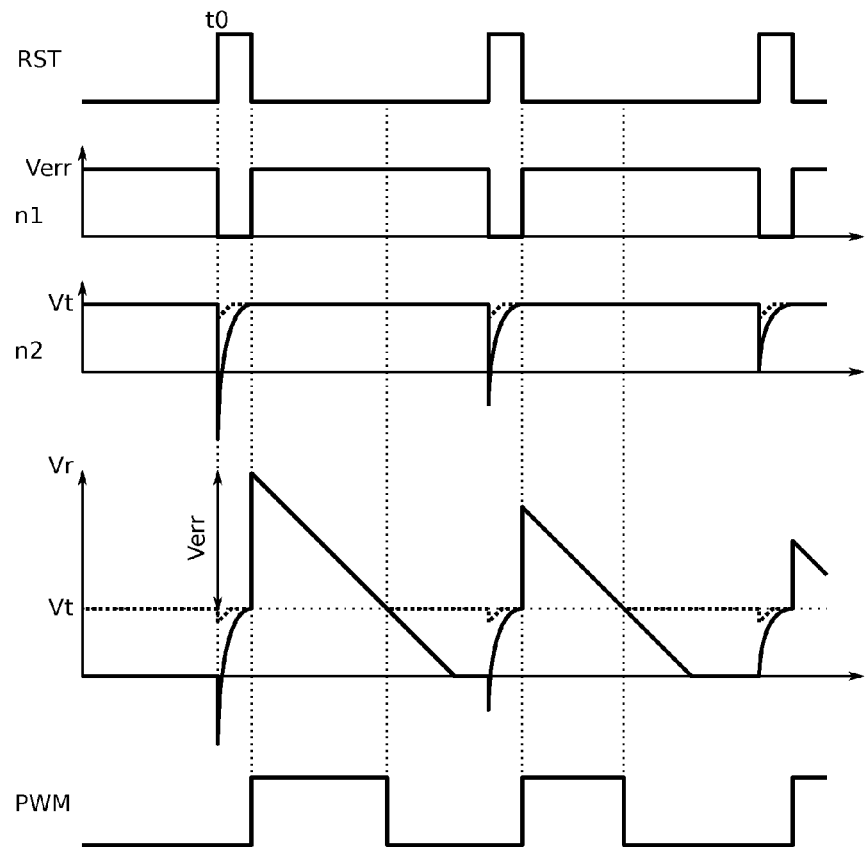
FIG. 5 is a more detailed chronogram showing the operation of the modulator of FIG. 4.

FIG. 5 is a chronogram showing the operation of the modulator of FIG. 4. It shows an example of evolution of the reset signal RST and of various resulting signals, in particular the voltage on a node n1 corresponding to the terminal of the capacitor connected to the switch S3, the voltage on a node n2 between the diode MD4 and the switch S1, the sawtooth voltage Vr, and the modulated signal PWM.

The signal RST determines by successive pulses the pulse width modulation intervals. It is generally periodic.

The signals shown in dotted lines correspond to an embodiment described below. Now, only the signals in solid lines are considered.

The signal RST is at zero when idle. The switches S1 and S2 are opened, whereas the switches S3 and S4 are closed. The node n1 is at the voltage Verr. The node n2 is at the threshold voltage Vt imposed by the diode MD4. The capacitor C is connected in series between the terminal receiving the voltage Verr and the current source MI3. At the end of a modulation interval, i.e., near the start of a new pulse RST, the current source MI3 ends up pulling the potential Vr on the capacitor toward a voltage near zero: the capacitor C is charged at the voltage Verr.

At a time t0, a pulse of the signal RST starts. The switches S1 and S2 are closed, connecting the capacitor C across diode MD4, whereas the switches S3 and S4 are open. The node n1 is pulled to the ground. Due to the charge in the capacitor, the diode MD4 is momentarily unbiased and the voltage on the node n2 drops by the voltage Verr across the capacitor. The voltage of the node n2 increases progressively, pulled by the current source MI7, until it reaches the value Vt imposed by the diode MD4. The voltage across the capacitor is then worth Vt. The duration of the pulse RST is preferably sufficient for this value Vt to be reached on the node n2 before the end of the pulse.

During this reset phase, the voltage Vr follows the voltage of the node n2. The voltage Vt preferably corresponds to the on/off threshold of the switching transistor MN1. Thus this value, reached by the signal Vr at the end of the reset phase, is still insufficient to turn on the transistor MN1, at least sufficiently to pull the input of the inverter 40 to the ground against the current source MI2.

Preferably, to guarantee that the voltage Vt imposed by the diode MD4 corresponds to the on/off threshold of the transistor MN1, the diode MD4 is formed by a transistor matched with the transistor MN1, and these transistors are both biased by a current of same value. To obtain currents of same value, the transistors forming the current sources MI2 and MI7 are also matched.

When the signal RST returns to its idle value, the switches S1 and S2 are opened, whereas the switch S3 is closed. The voltage Vr is subjected to a rising step of the value Verr; the voltage Verr carried by the switch S3 is superimposed to the charge voltage Vt of the capacitor to form the signal Vr.

The current source MI3 discharges the capacitor with a constant slope. The voltage Vr decreases linearly until reaching nearly zero.

During the phase where the signal Vr is above the value Vt, the transistor MN1 is on and pulls the input of the inverter 40 to zero. The result is a state at 1 of the signal PWM during this phase. As shown in FIG. 5 for successive modulation intervals, the duration at 1 of the signal PWM is proportional to the step of the signal Vr above Vt, i.e., the error voltage Verr.

Figure 6:
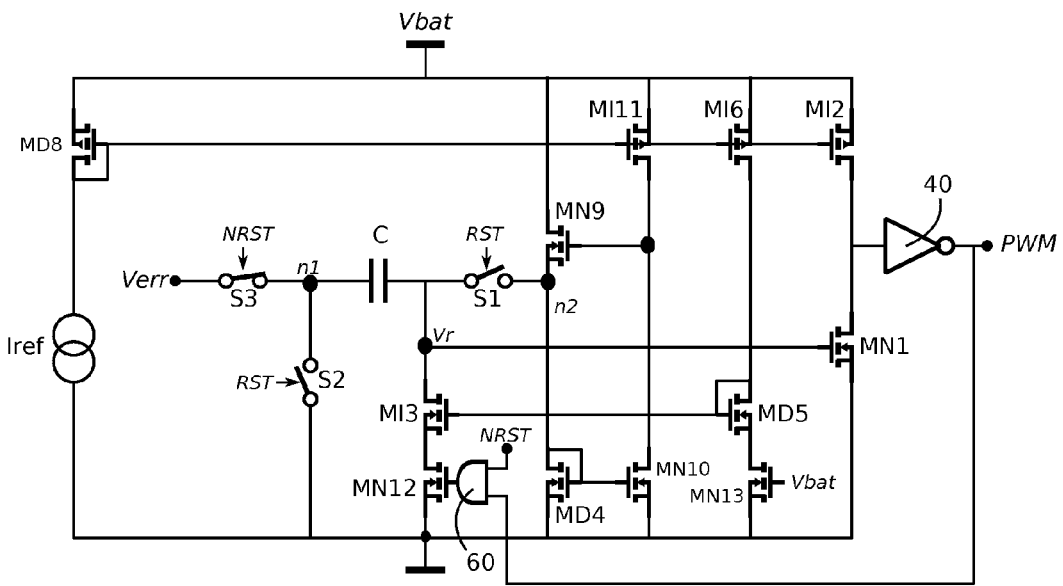
FIG. 6 schematically shows a second embodiment of a modulator without comparator.

FIG. 6 shows an embodiment of a modulator of the type of FIG. 4, comprising some enhancements.

The diode MD4 is integrated into a Wilson current mirror, which produces a node n2 having a low impedance. The Wilson mirror includes the diode MD4 and two N-channel MOS transistors MN9 and MN10. The transistor MN9 has its source connected to the diode MD4 (node n2) and its drain connected to the line Vbat. The gate of the transistor MN9 is connected to the drain of the transistor MN10. The gate of the transistor MN10 is connected to the node n2 and its source is connected to the ground. The input current of the Wilson mirror is supplied to the drain of the transistor MN10 by a current source MI11, a P-channel MOS transistor forming a mirror with the diode MD8.

The Wilson mirror operates so that the source voltage of the transistor MN9 establishes at a value such that the resulting current in the diode MD4 is equal to the current injected by the current source MI11.

Using this Wilson mirror, the transistor MN9 maintains the voltage of the node n2 at Vt, in particular during the reset phase, as shown in dotted lines in FIG. 5. It allows the duration of the pulses RST to be reduced, since the capacitor C is charged at low impedance by the transistor MN9. A risk of damaging the transistors connected to the node n2 by voltage levels which may exceed nominal values is also avoided. The voltage Vr corresponds to the voltage of the node n2 during the reset phases.

In addition, an N-channel MOS switching transistor MN12 replaces the switch S4 of FIG. 4 between the current source MI3 and the ground. The gate of this transistor is controlled by an AND gate 60 receiving on one input the inverse reset signal NRST. Another input of the gate 60 receives the signal PWM supplied by the inverter 40. To compensate for the influence of the transistor MN12 on the current mirror MD5/MI3, a transistor MN13 having the same characteristics as the transistor MN12 is arranged between the diode MD5 and the ground. The gate of the transistor MN13 receives the voltage Vbat, so that the transistor MN13 is always conductive.

With this configuration, the current source MI3 only produces current when useful, i.e., during the active phases of the signal PWM, where it is used to discharge the capacitor C. The current of the source MI3 is interrupted outside these phases, which allows the current consumption of the circuit to be reduced. As shown in dotted lines in FIG. 5, the result is that the signal Vr stabilizes at the value Vt at the end of each active phase.

In the FIG. 5 chronogram, it appears not to be useful to combine the signals NRST and PWM with an AND gate—the signal PWM alone may be enough to control the transistor MN12. However, when the duty factor of the signal PWM tends toward 1, it is the signal NRST that causes the transistor MN12 to turn off before the signal PWM, thus avoiding a current consumption during the reset phase.

The various embodiments described above can be combined to provide further embodiments. The embodiments may include structures that are directly coupled and structures that are indirectly coupled via electrical connections through other intervening structures not shown in the figures and not described for simplicity. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pulse width modulation device, comprising:
    a switching transistor configured to define modulation phases, the switching transistor having a gate and a source;
    a capacitor;
    switches configured to:
        in a first phase, charge the capacitor to a voltage corresponding to an on/off threshold of the switching transistor,
        in a second phase, couple the capacitor between a terminal arranged to apply a setpoint voltage and the gate of the switching transistor; and
    a constant current source coupled to apply a current in the capacitor tending to bring the gate of the switching transistor toward the on/off threshold.

2. The device of claim 1, comprising:
    the switching transistor having its gate coupled to a first terminal of the capacitor and its source coupled to a reference potential node;
    a diode coupled, in the first phase, between the first terminal of the capacitor and the reference potential node; and
    a transistor forming the constant current source, coupling the first terminal of the capacitor to the reference potential node.

3. The device of claim 2, wherein the diode is formed by a transistor having characteristics matching the switching transistor, the diode and the switching transistor being coupled to draw respective bias currents of a same value.

4. The device of claim 2, comprising:
    a circuit arranged to interrupt current of the current source while the switching transistor is off.

5. The device of claim 2, wherein the diode is part of a Wilson current mirror.

6. A method to generate signals for a switching transistor to perform a pulse width modulation, comprising:
    controlling a plurality of switches to generate a ramp signal, the ramp signal defining on and off phases of the switching transistor, the ramp signal having at periodic intervals:
        an initial value at an on/off threshold voltage of the switching transistor;
        a step exceeding the initial value by an error voltage corresponding to a duty factor setpoint of the pulse width modulation; and
        a ramp, having a same slope for each periodic interval, the ramp joining the step exceeding the initial value, whereby the duration of the on phase of the switching transistor is proportional to the error voltage, with the same proportionality coefficient for all the intervals; and
    applying the ramp signal to a gate of the switching transistor.

7. The method to generate signals for a switching transistor to perform a pulse width modulation of claim 6, wherein the initial value is generated in a first phase by charging a capacitor to a voltage corresponding to the on/off threshold voltage of the switching transistor.

8. The method to generate signals for a switching transistor to perform a pulse width modulation of claim 7, wherein the step exceeding the initial value by an error voltage corresponding to a duty factor setpoint of the pulse width modulation is generated by superimposing an error signal to a voltage of the charged capacitor.

9. The method to generate signals for a switching transistor to perform a pulse width modulation of claim 8, wherein the ramp is generated by discharging the capacitor.

10. A switching mode power supply control circuit, comprising:
- a capacitor having a first terminal and a second terminal;
- a first switch having a first terminal and a second terminal;
- a current mirror switch having a first terminal and a second terminal;
- a switching transistor having a gate, a source, and a drain, the source coupled to a ground node, and the gate coupled at a sawtooth signal node to the first terminal of the capacitor, the first terminal of the first switch, and the first terminal of the current mirror switch;
- a second switch having a first terminal and a second terminal, the second terminal of the second switch coupled to the ground node;
- a third switch having a first terminal and a second terminal, the first terminal of the third switch coupled to an error signal node, and the second terminal of the third switch coupled at a first node to the first terminal of the second switch and the second terminal of the capacitor;
- a threshold current source having a first terminal and a second terminal;
- a diode configured to determine an on/off threshold of the switching transistor, the diode having a first terminal and a second terminal, the first terminal of the diode coupled to the ground node, and the second terminal of the diode coupled at a second node to the second terminal of the first switch and a first terminal of the threshold current source;
- a fourth switch coupled between the second terminal of the current mirror switch and the ground node.

11. The switching mode power supply control circuit of claim 10 wherein a control terminal of the first switch is coupled at a reset signal node to a control terminal of the second switch, the reset signal node arranged to carry a reset signal, and wherein a control terminal of the third switch is coupled at an inverse reset signal node to a control terminal of the fourth switch, the inverse reset signal node arranged to carry an inverse reset signal that is in phase opposition to the reset signal.

12. The switching mode power supply control circuit of claim 11 wherein a drain terminal of the switching transistor is coupled at an output node to an output bias current source.

13. The switching mode power supply control circuit of claim 12, comprising:
- a sawtooth current source having a first terminal and a second terminal;
- a current mirror diode having a first terminal and a second terminal, the first terminal of the current mirror diode coupled at a biasing node to the first terminal of the sawtooth current source, wherein the second terminal of the current mirror diode is coupled to the ground node and the current mirror diode and the current mirror switch are coupled to form a current mirror circuit.

14. The switching mode power supply control circuit of claim 13, comprising:
- a reference current source arranged to produce a current proportionally copied by the threshold current source, the output bias current source, and the sawtooth current source, the proportional copying according to the size ratios of the respective current sources.

15. The switching mode power supply control circuit of claim 14 wherein the diode is formed by a transistor having characteristics matching the switching transistor and wherein the output bias current source has characteristics matching the sawtooth current source.

16. The switching mode power supply control circuit of claim 10 wherein the sawtooth signal node is arranged to have formed thereon a sawtooth voltage signal having a constant slope and a variable magnitude.

17. The switching mode power supply control circuit of claim 10 wherein the diode is formed by a transistor having characteristics matching the switching transistor.

18. The switching mode power supply control circuit of claim 10, comprising:
- a gate, the gate having a first input coupled to an inverse reset signal node a second input coupled to an output of the switching mode power supply control circuit, and an output coupled to a control terminal of the fourth switch.

19. The switching mode power supply control circuit of claim 10, comprising:
- an injection current source; and
- a current mirror transistor, wherein the current mirror transistor, the diode, and the threshold current source are integrated into a Wilson current mirror configured to operate such that a source voltage of the threshold current source establishes at a value such that a resulting current in the diode is equal to a current injected by the injection current source.

* * * * *